Nov. 17, 1959 J. J. SURAN 2,913,541

SEMICONDUCTOR WAVE FILTER

Filed Nov. 20, 1956

INVENTOR:
JEROME J. SURAN,
BY Robert J. Steinmeyer
HIS ATTORNEY

United States Patent Office 2,913,541

Patented Nov. 17, 1959

2,913,541

SEMICONDUCTOR WAVE FILTER

Jerome J. Suran, Syracuse, N.Y., assignor to General Electric Company, a corporation of New York Application November 20, 1956, Serial No. 623,494

5 Claims. (Cl. 179—171)

Figure 1:
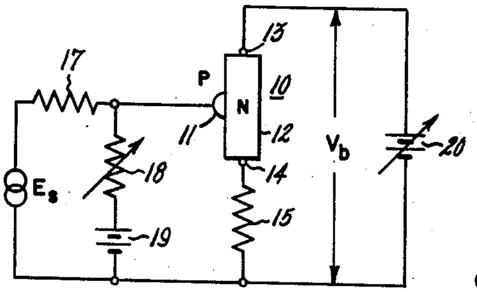

This invention relates to semiconductor wave translating networks and more particularly to circuits of this character utilizing the traveling wave properties of double-base diodes to obtain selective network characteristics.

The "double-base diode" has heretofore been described by Lesk, U.S. Patent No. 2,769,926 and Engel, U.S. patent application, Serial No. 373,828, both of which are assigned to the assignee of the present invention. The double-base diode is a three terminal semiconducting device having a single rectifying junction disposed intermediately between spaced ohmic electrodes. The physical characteristics of this device and its basic mode of operation are described in the above referenced patent application. The ohmic electrodes of the double-base diode serve respectively as output and common electrodes while the rectifying junction serves as an input electrode. The double-base diode exhibits an input characteristic having three dissimilar regions. The first region, termed the cut-off region, is characterized by a steeply rising voltage or slope attributable to the fact that the input junction is poled to oppose input current flow. As the input voltage increases to a given peak value, established by the interbase potential, the junction bias is reversed, and a negative resistance region occurs. The initial downward slope of the negative resistance region is quite steep, but the slope decreases to zero at a "valley point," after which the slope becomes positive. The region beyond the valley point is termed the saturating region, and is characterized by a low positive resistance. In both the negative resistance region and in the initial portion of the saturating region, the double-base diode exhibits active properties, having current gain.

In accordance with this invention, it has been found that double-base diodes exhibit traveling wave properties. Accordingly, it is an object of the present invention to provide a circuit utilizing a double-base diode to obtain selective network characteristics. The selectivity chacacteristics obtained follow a $$\frac{\text{sine } (X)}{X}$$

pattern.

Another object of this invention is to provide a new and improved filter network having a sharp cut-off characteristic which is tunable over a wide frequency range by variation of the interbase potential of a double-base diode.

It is a further object of this invention to provide a semiconductor network in which the frequency of maximum attenuation may be varied by changing the biasing potential on the double-base diode.

A further object of this invention is to provide a new and improved semiconductor selective network which combines simple and rugged construction with efficient operation.

These and other advantages of the invention will be more clearly understood from the following description taken in connection with the accompanying drawings, and its scope will be apparent from the appended claims.

Figure 2:
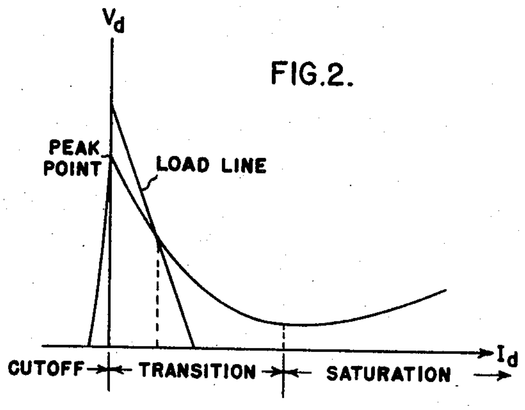
Figure 3:
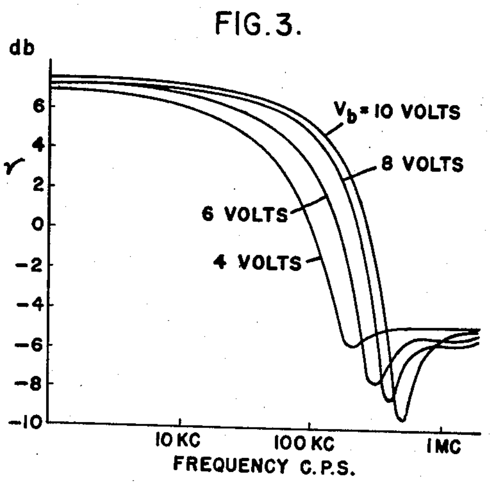
Figure 4:
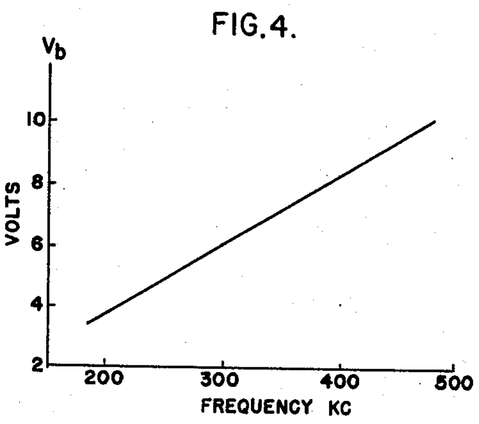

In the drawings,

Figure 1 is a diagrammatic illustration of the circuit of the invention,

Figure 2 illustrates the operating characteristic of the double-base diode in the circuit of Figure 1, Figure 3 shows a series of curves illustrating the frequency selective characteristics of the circuit of Figure 1, and Figure 4 shows a curve of interbase potential versus frequency to illustrate the flexibility of filter design by a change in interbase potential of the semiconductor device of Figure 1.

Referring now to Figure 1, there is shown a double-base diode 10 which consists of a bar or body 12 of semiconducting material, such as N-type silicon or germanium, having ohmic electrodes 13 and 14 attached at spaced points thereon, and a rectifying junction 11 which consists of an indium dot fused to a portion of the bar 12 within the region affected by an electric field that exists between electrodes 13 and 14 when the diode is energized. A source of biasing potential which provides this electric field is illustrated as a variable source of potential 20 having its positive pole connected to ohmic electrode 13 and its negative pole connected through a load resistance 15 to ohmic electrode 14. Another source of biasing potential is shown as a source 19 having its positive pole connected through variable resistance 18 to junction 11 and its negative pole connected through resistance 15 to ohmic electrode 14. A signal energy source $E_s$ is applied to resistance 17 to excite the junction 11 of the double-base diode 10.

The operating characteristic shown in Figure 2 is obtained by measuring the voltage $V_d$ between the junction 11 of semiconductor 10 and ohmic electrode 14 as a function of current $I_d$ through junction 11. Ohmic electrode 14 is hereinafter referred to as base-one. The negative slope or negative resistance region of the double-base diode operating characteristic represents its active state and is the operating region which is utilized in the present invention. By properly proportioning the potential of sources 19 and 20 and the magnitude of resistances 15 and 18, the operating point of the double-base diode 10 may be stabilized in the transition or negative resistance region of its operating characteristics.

The conditions required for such stabilization are that resistor 18 be greater in magnitude than the intrinsic negative resistance of the double-base diode between the junction 11 and the base 14 of Figure 1, and that the external interterminal capacity distributed between the points 11 and 14 be less than the value required to sustain the device in a regenerative relaxation mode of oscillation.

These conditions are mathematically given by:

$$R > \left[ (\gamma_o - 1)\left(\frac{r_{B1} r_{B2}}{r_{B1} + r_{B2}}\right) - r_D = |R_n| \right] \text{ and } C < t_t/3|R_n|$$

where R and C are the series resistance 18 and the interterminal capacitance between points 11 and 14 respectively, $\gamma$ is the internal current amplification factor of the double base diode, $r_{B1}$ and $r_{B2}$ are respectively the equivalent base-one and base-two resistances of the double-base diode bar (12 in Fig. 1), $r_D$ is the equivalent junction resistance and $t_t$ is the transit time of minority carriers between the junction and base-one leads. $|R_n|$ is the absolute value of the negative resistance.

The desired operation according to the invention is shown graphically by the load line in Figure 2. Operation of double-base diode 10 along this load line results in stabilization of the device in the negative resistance region near the peak point of the operating characteristic, which represents a strong field condition within the double-base diode 10. The operating point represented by the intersection of the load line with the input characteristic of double-base diode 10 is the operating point which is set by the proper biasing potentials and load resistance 15. The magnitude of the input signal $E_s$ must remain small enough so that the operation of the device remains within the strong field region along its negative characteristic. Thus, the circuit of Fig. 1 operates as a small signal amplifier.

In operation, when the junction 11 of double-base diode 10 is biased in the forward direction, namely the P-type region is made positive with respect to the N-type region, minority carriers are injected into the bar 12. This results in a reduction of the resistivity in the bar between junction 11 and ohmic electrode 14 or base-one, thereby causing a steady-state current to flow through the bar and load resistance 15. The operating point in this instance is that which appears on Figure 2 at the intersection of the load line and the operating characteristic of double-base diode 10. By exciting junction 11 with an input signal $E_s$ which is limited in amplitude such that double-base diode 10 continues to operate in the transition or negative resistance region of its characteristic, the resistivity of bar 12 is varied above and below the steady-state operating point in accordance with the magnitude and at the frequency of the input signal. Since ohmic electrode 13, or base-two of double-base diode 10 is biased more positively than the junction 11, the holes or minority carriers which are injected into the bar at junction 11 cannot drift into the base-two region, but are propagated along the bar between junction 11 and the base-one region by a strong field. The minority carriers travel between junction 11 and the base-one region with a certain velocity which is determined by the electric field gradient along this path. The current appearing in the base-one region at ohmic electrode 14 depends on the number of holes emitted, since it can be assumed that the electric field in bar 12, the resistance of which is being varied by the injection of carriers, remains substantially constant (for small A.-C. signals). At a relatively low frequency, the period of the alternating input signals $E_s$ is long compared to the transit time of the holes traveling from junction 11 to base-one. Therefore, the travel of the injected carriers along the bar from junction 11 to base-one of double-base diode 10 is virtually instantaneous relative to the time rate of change of the input signal. This produces a current at base-one which is greater than the steady-state current value by an amount proportional to the reduction of resistivity of the bar due to the injection of carriers caused by the input signal.

As the frequency of the input signal is increased, the rate of injection becomes significant compared to the transit time of the carriers. Finally, a frequency is reached where the level of carrier density in the vicinity of the junction is in excess of the average value of the A.C. signal whereas the carrier density near the base-one lead is below such average level. Consequently, as a result of the phase shift of carriers due to their finite velocity, the local resistance of the bar in the vicinity of the junction may be lower than the D.C. resistance while the local resistance in the vicinity of the base-one lead may be greater than the D.C. resistance. When the phase shift is such that the reduced resistivity due to a momentary high carrier concentration in the vicinity of the junction is just equal to the increased resistivity due to a momentary low carrier concentration in the vicinity of the base-one lead, the net change in bar resistance is zero and hence the A.C. resistance of the bar between the junction 11 and base-one at this frequency point is infinite. This condition represents an A.C. resonance which may be compared to the resonance of a parallel tuned tank circuit at the resonant frequency. Even more accurately, as will be seen, it may be compared with the resonant characteristic of an unmatched transmission line.

As the signal frequency at the junction is increased beyond the first resonant frequency, a full cycle of carrier density distribution will be maintained in the bar, but a net A.C. resistance modulation recurs due to the unbalanced carrier density in the portion of the bar which is not spanned by a full cycle. Finally, at a frequency which is just twice the first resonant frequency, another resonant point (infinite A.C. resistance) is encountered due to the storage of exactly two cycles of carriers in the bar. This procedure is repetitive at still higher frequencies. The propagation and phase shift of carriers described above shows that the density distribution of carriers in a double-base diode exhibits a traveling wave characteristic which results in a current transfer ratio, between base-one and the junction, of the form given by $$\frac{\text{sine }(X)}{X}$$

To further explain the traveling wave phenomena exhibited by the circuit of Figure 1 and by way of example only, the curves shown in Figure 3 were obtained. The following are the circuit parameters which were used:

Resistance 17=100,000 ohms
Resistance 18=100,000 ohms
Source 19=5 volts
Resistance 15=50 ohms
Source 20=10 volts maximum For the double-base diode 10, the bar 12 consisted of N-type zone refined crystal germanium having a bar resistivity of 40 ohms-centimeters, an area of 130 square mils and a length of 30 mils. Junction 11 was made to bar 12 by alloying indium into the N-type bar 12, the junction being positioned on the bar such that it was 10 mils from ohmic electrode 13, or base-two, and 20 mils from ohmic electrode 14, or base-one. A tin-antimony mixture was used for the ohmic contacts 13 and 14.

The curves of Figure 3 show a plot of $\gamma$, which is the ratio of base-one current to junction current of double-base diode 10, versus input signal frequency. The zero db level which is used as a reference point for these curves corresponds to the steady-state operation of the circuit of Figure 1 at zero or very low signal frequency. The curves or current transfer characteristics of Figure 3 clearly show that changes in the interbase potential vary the resonant point of the current transfer characteristic. This is to be expected since the transit time of the carriers through the bar is inversely proportional to the interbase potential. A higher interbase potential produces a higher resonant frequency. Figure 4 shows a curve of the resonant frequency as a function of interbase potential for the circuit of Figure 1. It can be seen that the resonant frequency increases linearly with an increase in interbase potential.

The curves of Figure 3 also show that the input signal follows a $$\frac{\text{sine }(X)}{X}$$

characteristic which represents the propagation of a traveling wave along the bar 12 of double-base diode 10. Theoretically, the curves should reach another resonant point which would correspond to the second harmonic of their first resonant frequencies if adhering strictly to the $$\frac{\text{sine}\,(X)}{X}$$

characteristic. For this to occur, the assumption must be made that all of the carriers which are injected at junction 11 of double-base diode 10 reach the base-one region. This is not true due to the loss associated with the recombination of holes and electrons within the bar, such losses becoming higher with increasing frequency.

As can be seen from the curves of Figure 3, the circuit of Figure 1 may be utilized as a low-pass filter. The characteristics of this filter may be varied by varying the interbase potential or by varying the biasing potential on junction 11 of double-base diode 10. Although an N-type bar and P-type dot are shown and described, it will appear obvious to those skilled in the art that P-type bar and an N-type dot may be utilized by merely reversing the polarities of the biasing potentials.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. In a selective signal network, a semiconductor device having a semiconducting body with at least two spaced ohmic electrodes thereon and a rectifying junction associated therewith in a region affected by an electric potential existing between said ohmic electrodes, said semiconductor device having an operating characteristic which includes a negative resistance region, means for stabilizing the operating point of said semiconductor device in the negative resistance region of its operating characteristic, and means for supplying an input signal having a predetermined magnitude to said rectifying junction small enough so that the operation of said semiconductor device is maintained within the negative resistance region of its operating characteristic, and whereby a sharp frequency cutoff characteristic is obtained in said network.

2. In combination, a semiconductor device having a body of semiconductor material of one type with first and second ohmic electrodes at spaced points thereon, and a region of opposite conductivity type intermediate said ohmic electrodes forming a semiconductor junction with said body, said semiconductor device having an operating characteristic which includes a negative resistance region, a first source of potential connected in closed series circuit with said junction and said second ohmic electrode, a second source of potential connected in closed series circuit with said ohmic electrodes, means for stabilizing the operation of said device within the negative resistance region of its operating characteristic, means for exciting said semiconductor junction with an input signal having a predetermined magnitude small enough so that said semiconductor device is maintained within the negative resistance region of its operating characteristic, and means for varying the magnitude of said second source of potential whereby the cut-off frequency of said semiconductor is varied.

3. In a selective signal network having sharp cut-off characteristics, a semiconductor device having a semiconducting body with at least two spaced ohmic electrodes thereon and a rectifying junction associated therewith in a region affected by an electric potential existing between said ohmic electrodes, said semiconductor device having an operating characteristic which includes a negative resistance region, a source of potential connected in closed series circuit with said electrodes, means for stabilizing the operating point of said semiconductor device in the negative resistance region of its operating characteristic, means for supplying a predetermined input signal to said rectifying junction small enough so that the operation of said semiconductor device is maintained within the negative resistance region of its operating characteristic, and means for varying said source of potential whereby the cut-off characteristics of said network are varied.

4. A selective signal amplifying network having a sharp frequency cutoff characteristic comprising a semiconductor device having a body of semiconductor material of one type with first and second ohmic electrodes at spaced points thereon, and a region of opposite conductivity type intermediate said ohmic electrodes forming a semiconductor junction with said body, said semiconductor device having an operating characteristic which includes a negative resistance region, a load impedance, a first source of direct potential connected in closed series circuit with said load impedance and said ohmic electrodes, a second source of direct potential, a biasing resistance, means for connecting said second source and said resistance in closed series biasing circuit with said junction and said second ohmic electrode, signal input means connected in circuit between said semiconductor junction and said second ohmic electrode, said signal input means and said biasing circuit providing a combined input capacitance between said semiconductor junction and said second ohmic electrode which is less than the transit time of minority carriers between the junction and the second ohmic electrode divided by three times the absolute value of the absolute negative resistance of said device, and said biasing resistance having a magnitude greater than the absolute value of the negative resistance of said device, the potentials of said first and second source of direct potential and the magnitudes of said biasing resistance and said load impedance being of such proportions as to stabilize the operation of said device within the negative resistance region of its operating characteristic, said signal input means being adapted for applying an input signal having a predetermined maximum magnitude sufficiently small so as to continuously maintain said semiconductor device operation in the negative resistance region, whereby said semiconductor device network has a frequency selective characteristic of a $$\frac{\text{sine}\,(X)}{X}$$

pattern.

5. A selective signal amplifying network having a sharp frequency cutoff characteristic comprising a semiconductor device having a body of semiconductor material of one type with first and second ohmic electrodes at spaced points thereon, and a region of opposite conductivity type intermediate said ohmic electrodes forming a semiconductor junction with said body, said semiconductor device having an operating characteristic which includes a negative resistance region, a first source and a second source of direct potential, a load impedance, means for connecting said first source and said load impedance in closed series circuit with said ohmic electrodes, a resistance, means for connecting said second source and said resistance in closed series biasing circuit with said junction and said second ohmic electrode, signal input means connected in circuit between said semiconductor junction and said second ohmic electrode, said signal input means and said biasing circuit providing a combined input capacitance between said semiconductor junction and said second ohmic electrode which is less than the transit time of minority carriers between the junction and the second ohmic electrode divided by three times the absolute value of the absolute negative resistance of said device, and said biasing resistance having a magnitude greater than the absolute value of the negative resistance of said device, the potentials of said first and second source of direct potential and the magnitudes of said resistance and said load impedance being of such proportions as to stabilize the operation of said device within the negative resistance region of its operating characteristic, said signal input means being adapted for applying an input signal having a predetermined maximum magnitude sufficiently small so as to continuously maintain said semiconductor device operation in the negative resistance region, whereby the current through said load impedance is a replica of said input signal substantially attenuated above a given cutoff frequency, means for varying the magnitude of said first source of potential whereby said cutoff frequency is varied.

References Cited in the file of this patent

UNITED STATES PATENTS

| | | |
|---|---|---|
| 2,502,479 | Pearson et al. | Apr. 4, 1950 |
| 2,600,500 | Haynes et al. | June 17, 1952 |
| 2,666,814 | Shockley | Jan. 19, 1954 |
| 2,691,736 | Haynes | Oct. 12, 1954 |
| 2,744,970 | Shockley | May 8, 1956 |
| 2,761,020 | Shockley | Aug. 28, 1956 |
| 2,778,885 | Shockley | Jan. 22, 1957 |
| 2,778,956 | Dacey et al. | Jan. 22, 1957 |
| 2,802,117 | Mathis et al. | Aug. 6, 1957 |
| 2,805,347 | Haynes | Sept. 3, 1957 |